United States Patent
Op 't Eynde et al.

(10) Patent No.: US 9,584,146 B2
(45) Date of Patent: Feb. 28, 2017

(54) SYSTEM AND METHOD FOR MEASURING THE DC-TRANSFER CHARACTERISTIC OF AN ANALOG-TO-DIGITAL CONVERTER

(71) Applicant: MediaTek Inc., Hsin-Chu (TW)

(72) Inventors: Frank Op 't Eynde, Wilsele (BE);
Nathan Egan, Burlington, MA (US);
Khurram Muhammad, Fort Worth, TX (US); Tien-Yu Lo, Hsinchu (TW);
Chi-Lun Lo, Taoyuan County (TW);
Michael A. Ashburn, Groton, MA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/886,545

(22) Filed: Oct. 19, 2015

(65) Prior Publication Data
US 2016/0211861 A1   Jul. 21, 2016

Related U.S. Application Data

(60) Provisional application No. 62/104,207, filed on Jan. 16, 2015.

(51) Int. Cl.
*H03M 1/10* (2006.01)
*H03M 1/12* (2006.01)
*H03M 3/00* (2006.01)

(52) U.S. Cl.
CPC ......... *H03M 1/109* (2013.01); *H03M 1/1038* (2013.01); *H03M 1/12* (2013.01); *H03M 3/50* (2013.01)

(58) Field of Classification Search
CPC .................................................. H03M 3/384

USPC .......................... 341/143, 155, 144, 118, 120
See application file for complete search history.

(56) References Cited

U.S. PATENT DOCUMENTS

| 5,237,332 | A | * | 8/1993 | Estrick | H04B 17/20 |
| | | | | | 330/259 |
| 8,760,333 | B2 | | 6/2014 | Op 't Eynde | |
| 2010/0328125 | A1 | * | 12/2010 | Pagnanelli | H03M 3/468 |
| | | | | | 341/143 |
| 2012/0194369 | A1 | | 8/2012 | Galton et al. | |
| 2015/0188555 | A1 | * | 7/2015 | Kimura | H03M 1/0634 |
| | | | | | 341/118 |

OTHER PUBLICATIONS

Kim, J. et al., "Analysis and Design of Voltage-Controlled Oscillator based Analog-to-Digital Converter," IEEE Transactions on Circuits and Systems, Jan. 2010, pp. 18-30, Fig. 16.
Larson, L.E. et al., "Multibit Oversampled Σ-Δ A/D Convertor with Digital Error Correction," Electronics Letters, 24: 1051-1052, Aug. 1988.

* cited by examiner

*Primary Examiner* — Peguy Jean Pierre
(74) *Attorney, Agent, or Firm* — Wolf, Greenfield & Sacks, P.C.

(57) ABSTRACT

Systems and methods for measuring and compensating a DC-transfer characteristic of analog-to-digital converters are described. A test-signal generator comprising a sigma-delta modulator may provide calibration signals to an ADC. An output from the ADC may be filtered with a notch filter to suppress quantization noise at discrete frequencies introduced by the sigma-delta modulator. The resulting filtered signal may be compared against an input digital signal to the test-signal generator to determine a transfer characteristic of the ADC.

19 Claims, 7 Drawing Sheets

SYSTEM AND METHOD FOR MEASURING THE DC-TRANSFER CHARACTERISTIC OF AN ANALOG-TO-DIGITAL CONVERTER

RELATED APPLICATIONS

This application claims the benefit of U.S. provisional Application Ser. No. 62/104,207, titled "System for Measuring the DC-Transfer Characteristic of an ADC and Method Therefore," filed on Jan. 16, 2015. The entire disclosure of the foregoing application is incorporated herein by reference.

BACKGROUND

Technical Field

The technology relates to circuits, systems, and methods for measuring and compensating a DC-transfer characteristic of analog-to-digital converters.

Discussion of the Related Art

Analog-to-digital converters (ADCs) are widely used in various electronic apparatus and systems such as mobile phones, audio equipment, image-capture devices, video equipment, wireline communications systems, sensors and measurement equipment, and radar systems, amongst others. A typical ADC is an electronic circuit configured to receive an analog signal, which typically is a time-varying signal, repeatedly sample the analog signal at discrete time intervals, and output a digital signal (e.g., a bit sequence or digital word) for each sampled time interval that is representative of a value of the analog signal during the sampling interval. Because the output of an ADC is a bit sequence, the analog signal is discretized into a number $M=2^N$ of integer values. The number N is referred to as the bit resolution of the ADC. For example, if an ADC is an 8-bit device, then an input signal can be discretized into $2^N=256$ values (e.g., 0, 1, 2, 3 . . . 255). In some cases, the discretized values may range from negative to positive values (−64, −63, . . . −1, 0, 1, . . . 62, 63). For an ideal ADC, the output bit value will be linearly proportional to the sampled analog signal value over a full input voltage range that is accepted by the ADC.

There are several types of conventional ADCs, and they may be divided into two groups: ADCs with single-bit quantization (e.g., a comparator) and ADCs with multi-bit quantization (e.g., N-bit ADCs). Multibit quantizing ADCs may include voltage-controlled-oscillator (VCO)-based ADCs and sigma-delta-modulator-based ADCs among others. Multibit quantizing ADCs typically exhibit nonlinear quantization characteristics when converting analog signals to digital signals. These nonlinear characteristics might result in gain error, offset error, quantization noise, flicker noise, and/or other signal-distortion errors for a converted analog signal. As a result, conventional ADCs typically do not ideally convert analog signals to digital signals, so that additional measures may need to be taken to correct the converted signals and increase the accuracy of an ADC.

Some approaches for reducing nonlinear quantization errors have been described in the literature. For example, dynamic element matching has been described and allows converting signal distortion of an ADC into noise. Alternatively, nonlinear quantization characteristic can be measured and stored in digital or analog memories. These stored values can then be used later to perform a correction during the analog-to-digital conversion. This approach is described, e.g., in Larson, L. E., Cataltepe, T., and Temes, G. C., "Multibit Oversampled ΣΔ A/D Converter with Digital Error Correction," *Electronics Letters,* 24: 1051-1052, August 1988.

SUMMARY

Circuits, systems, and methods associated with measuring and compensating a DC-transfer characteristic of analog-to-digital converters are described. A simple, test-signal generator may be used to apply calibration signals to an ADC. In some cases, the test-signal generator may be integrated on a same chip with the ADC. The test-signal generator may introduce noise tones at discrete frequencies that appear at the output of the ADC. Notch filtering can be employed to suppress the noise tones and provide output values from the ADC that can be compared against input values applied to the test-signal generator. Based on the comparison, DC-transfer characteristic of the ADC can be determined, correction values may be computed, and the correction values stored for subsequently correcting digital output from the ADC.

According to some embodiments, a calibration circuit for an analog-to-digital converter may comprise a test-signal generator configured to be connected to an analog input of the ADC and a digital filter connected to an output of the ADC. The digital filter may have attenuating notches at a plurality of frequencies that correspond to frequencies at which quantization noise tones are generated by the test-signal modulator.

Methods of operation are also contemplated. According to some embodiments, a method for calibrating an ADC may comprise acts of applying a calibration signal from a test-signal generator to an analog input of the ADC, and filtering an output digital signal from the ADC with a digital filter, wherein the digital filter has attenuating notches at a plurality of frequencies that correspond to frequencies at which quantization noise tones are generated by the test-signal generator.

The foregoing apparatus and method embodiments may be included in any suitable combination with aspects, features, and acts described in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not

Features and advantages of the illustrated embodiments will become more apparent from the detailed description set forth below when taken in conjunction with the drawings.

DETAILED DESCRIPTION

Figure 1A:
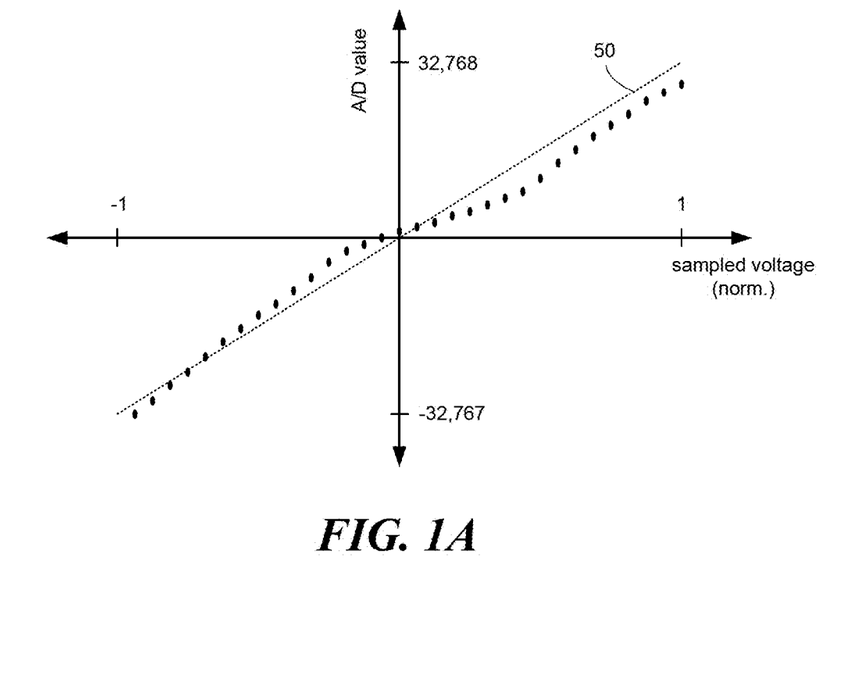
FIG. 1A depicts nonlinearity of analog-to-digital conversion, according to some embodiments.

The inventors have recognized and appreciated that the performance of some conventional multibit-quantizing ADCs can be improved by measuring DC-transfer characteristic of an ADC and applying signal-correction after conversion to compensate for conversion-related nonlinearities and distortions introduced by an ADC. FIG. 1A depicts just one example of how quantization errors may be exhibited by an ADC. When an analog signal 50 is swept linearly over a range of values that span the ADC's accepted input voltage range and the ADC samples the analog signal at discrete voltage levels over this range, the converted digital values (indicated by the elliptical dots) typically do not correlate perfectly with the sampled analog voltage values. Instead of ideal conversion to values matching the sampled values of the analog signal 50, the actual converted values stray from the dotted line. These conversion errors can lead to downstream data processing errors in some devices. For example, many smart phones and wireless communication devices employ ADCs in the front end of the device's radio-frequency receiver circuitry. Conversion errors by these ADCs can result in corrupted data downstream. In severe cases, a dropped communication link may result.

The inventors have conceived and developed calibration circuitry and systems for applying calibration signals from a simplified test-signal source to an input of an ADC, filtering the output signal from the ADC to selectively suppress noise introduced by the test-signal source, and measure the resulting signal to determine a transfer characteristic of the ADC.

The inventors have further recognized and appreciated that measurement techniques can be implemented to reduce unwanted effects of noise during calibration. In some implementations, the calibration circuitry may be included on-chip (i.e., integrated onto a same chip with an ADC), so that ADC errors can be measured and corrected at any time the ADC is in operation.

Figure 1B:
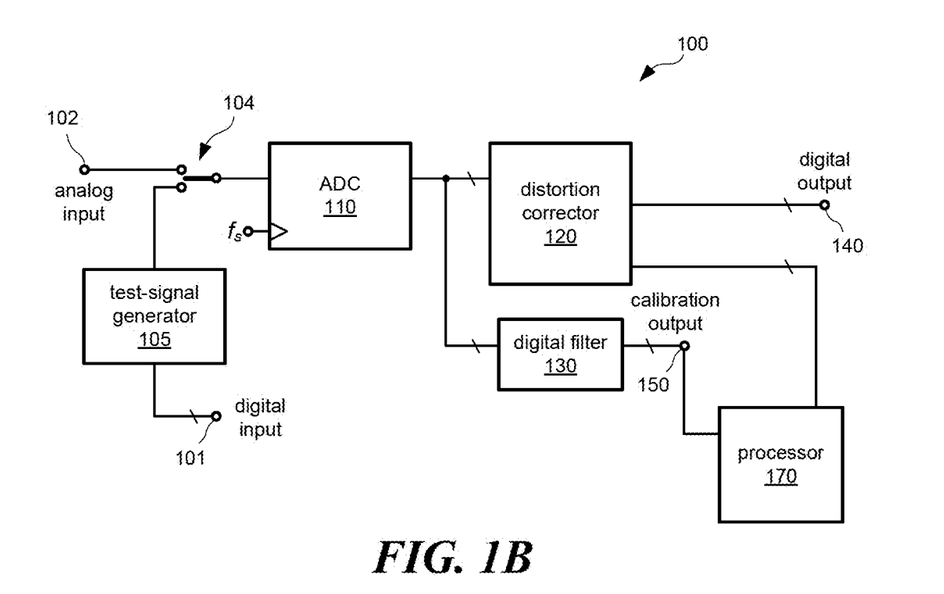
FIG. 1B depicts a circuit for calibrating an ADC, according to some embodiments.

In overview and referring now to FIG. 1B, an embodiment of a system 100 for measuring a DC-transfer characteristic of an ADC and calibrating the ADC may comprise a test-signal generator 105 that is arranged to be connected via a first switch 104 (e.g., a transistor switch) to an analog-to-digital converter 110 for which a DC-transfer characteristic are to be measured. An output of the ADC 110 may connect to a distortion corrector 120 and also to a digital filter 130, according to some embodiments. In some implementations, the digital filter 130 may be connectable to the ADC output via a second switch (not shown). An output from the digital filter 130 may connect to a signal processing circuit 170, and an output from the distortion corrector 120 may connect to a digital output terminal 140 to provide corrected digital values to downstream data-processing elements. For example, data from output terminal 140 may be provided to signal decoding apparatus in a wireless communication device.

The ADC 110 may be any type of multi-bit analog-to-digital converter. The ADC may be a VCO-based ADC or may comprise a sigma-delta modulator, according to some embodiments. The sigma-delta modulator may be a first-order or second-order sigma-delta modulator. In some embodiments, the sigma-delta modulator may be a third-order, or higher-order, sigma-delta modulator. The ADC may receive a clock signal having a frequency $f_s$ that determines a sampling frequency of the ADC.

A signal processing circuit 170 may comprise logic elements and other circuit elements arranged to at least receive and process signals from the output of the digital filter 130. For example, signal processing circuit 170 may compare signals received from digital filter 130 with signals applied to the test-signal generator 105. In some embodiments, signal processing circuit 170 may comprise a microprocessor of an electronic device such as a smart phone. In some implementations, signal processing circuit 170 may comprise a digital subtraction circuit, a digital comparator, a digital-signal processor, a field-programmable gate array, a microcontroller, or a combination thereof.

In normal operation, the switch 104 may connect the analog input terminal 102 to the ADC. An analog signal received at an analog input terminal is converted by the ADC 110 to an N-bit digital signal, where N corresponds to the resolution of the ADC. The analog signal may be received from a low-noise amplifier of a radio-frequency receiver. The value N may be equal to or greater than 12, in some embodiments. In some cases, N may be may be equal to or greater than 16. In some implementations, N may be any integer value from 12 to 24.

The ADC may introduce conversion errors, as described in connection with FIG. 1A, when converting the received analog signal, and these conversion errors may change over time. For example, the magnitude of the conversion errors may be dependent upon a current temperature of the ADC 110. The output from the ADC may be provided to a distortion corrector 120 that applies corrections to the converted digital signals to compensate for the conversion errors introduced by the ADC. The applied corrections improve the accuracy of the analog-to-digital conversion. The corrected digital signals may then be provided as a digital output bit stream (in serial or parallel) at the output terminal 140. In some implementations, the bit stream may be provided to a signal processing circuit 170.

To obtain an accurate digital signal from a distortion corrector 120, the correction values that are applied by the distortion corrector should be determined with a high degree of accuracy. Correction values may be determined by accurately measuring conversion distortions of the ADC 110. These conversion distortions may be determined from calibration measurements that can be made at any time for the ADC using the calibration system 100. Calibration measurements may be made by configuring the switch 104 to connect the test-signal generator 105 to the ADC, disconnecting the analog input, applying a sequence of calibration signals to the ADC, and evaluating output signals from the ADC to determine whether they match the calibration signals applied to the ADC. One method for applying calibration signals to the ADC is to apply carefully calibrated DC voltages at the input of the ADC. However, carefully calibrated DC voltages for an ADC having 12-bit resolution or greater requires a precision DC voltage source, which the inventors have recognized can be difficult and/or expensive to implement on-chip.

Instead of using a precision DC source, the inventors have recognized and appreciated that a simplified test-signal generator 105 may be used in some implementations to provide calibration signals to the ADC. Inputs to the simplified test-signal generator may be digital words applied at a calibration input terminal 101. The input digital words may come from an on-chip source (e.g., signal processing circuit 170) or off-chip source. The test-signal generator converts a digital word to a calibration signal that is applied to the ADC 110. The ADC converts the calibration signal back to a digital word that is filtered by the digital filter 130 for reasons explained in further detail below. A digital word applied to the test-signal generator can be compared against a filtered digital output (taken after digital filter 130) from the ADC to determine conversion errors of the ADC with a high degree of accuracy.

As a simplified example for a 6-bit ADC, if a digital word [000011] is applied to the test-signal generator 105 and an output from the digital filter 130 is found to be [000101], then a correction value of [000010] may be computed by the signal processing circuit 170 as a value to subtract from converted ADC output values of [000101]. The correction value may be sent to and stored by the distortion corrector 120 for use during normal operation. Further details of the test-signal generator 105, distortion corrector 120, and digital filter will now be described.

Figure 2A:
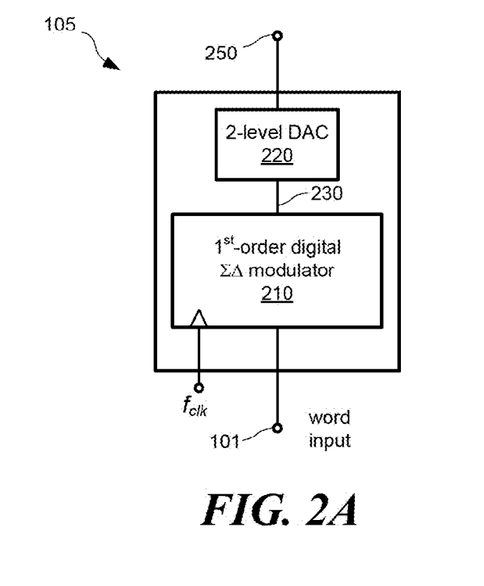
FIG. 2A depicts a test-signal generator, according to some embodiments.

FIG. 2A depicts one embodiment of a test-signal generator 105. According to the illustrated embodiment, a test-signal generator 105 may comprise a first-order, digital sigma-delta modulator 210 and a two-level, digital-to-analog converter 220. Since signal bandwidth of the calibration signal can be low for calibration purposes, a test-signal generator that converts digital words to a test signal with a low conversion speed is sufficient. Accordingly, any suitable digital sigma-delta modulator 210 (e.g., first order or second order sigma-delta modulator) may be used to provide a calibration signal to the ADC. The sigma-delta modulator 210 may be located on-chip or off-chip.

Figure 2B:
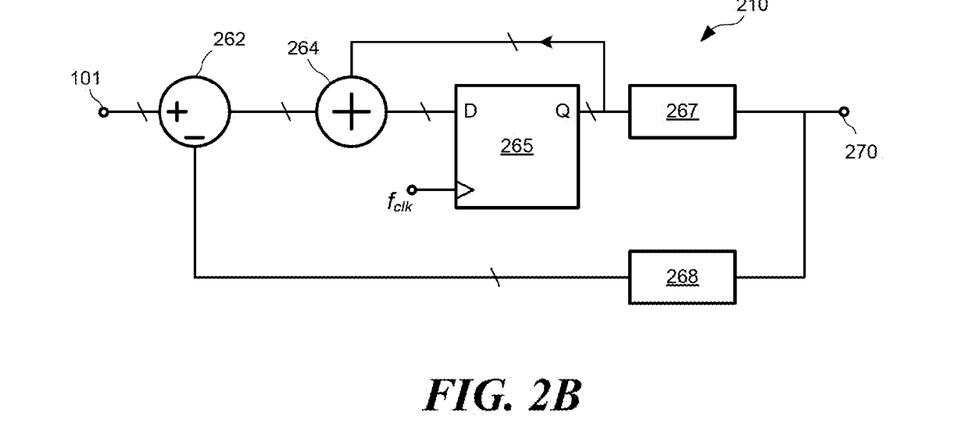
FIG. 2B depicts a circuit diagram for a first-order, digital, sigma-delta modulator, according to some embodiments.

An example of a first-order, digital sigma-delta modulator is depicted in the circuit diagram of FIG. 2B. A digital sigma-delta modulator may comprise an input terminal 101 configured to receive a digital word and coupled to a digital subtractor 262. The subtractor may receive a second digital signal from a one-bit digital-to-digital converter 268, and provide a difference between its received digital values to a digital adder 264. The adder 264 may receive an output from register 265 and provide a sum of its two received digital signals to an input of the register 265. The register may be clocked a frequency $f_{clk}$. The output from the register may be provided to a digital comparator 267 that compares the register output value against a reference digital value. According to some embodiments, a most significant bit (MSB) value from the comparator 267 may be provided as an output signal to output terminal 270. The output signal may then vary between only two levels.

Figure 2C:
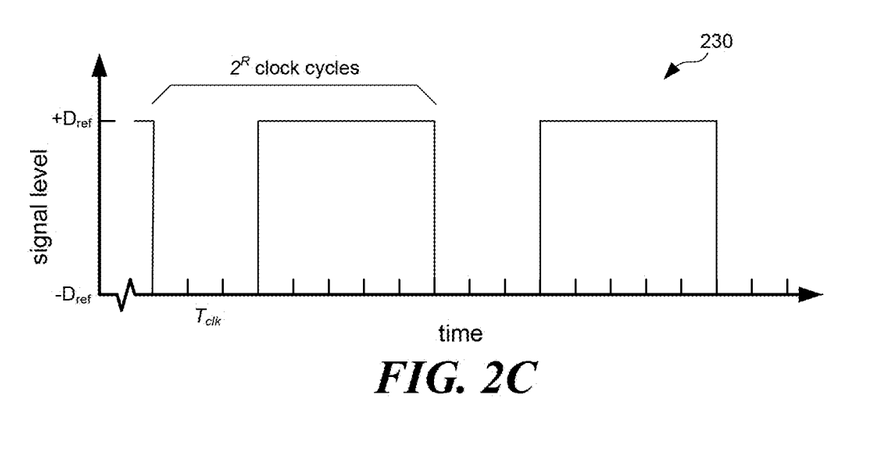
FIG. 2C depicts a pulse-density modulated signal from a digital sigma-delta modulator, according to some embodiments.

The sigma-delta modulator 210 may receive an R-bit digital input word representing the desired value of the DC signal at node 250, and output a pulse-density modulated bit stream 230 that toggles between two digital values $+D_{ref}$ and $-D_{ref}$ at each calibration point. An example of a pulse-density modulated bit stream from a digital sigma-delta modulator 210 for one calibration point is depicted in FIG. 2C. To simplify the example and diagram, a 3-bit word is assumed for the digital input to the sigma-delta modulator. For R=3, where the received word is [101] for one calibration point, an output signal from the digital sigma-delta modulator may alternate between a low value for three clock cycles and a high value for five clock cycles. The signal may repeat until the input digital word is changed to a different value.

Figure 2D:
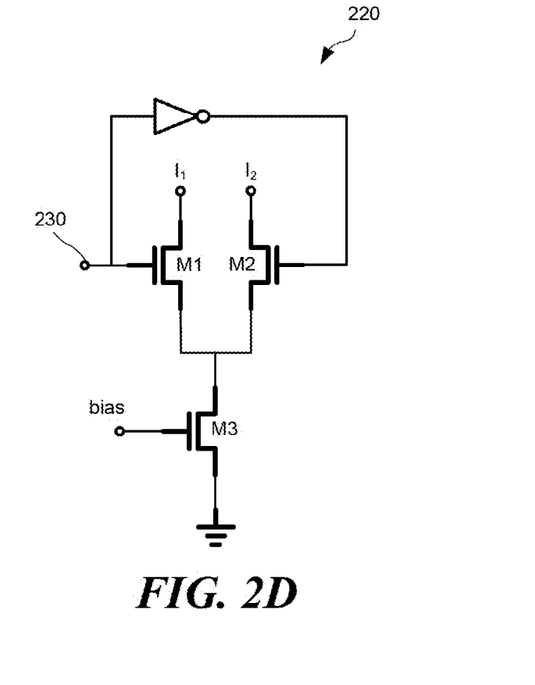
FIG. 2D depicts a two-level current source, according to some embodiments.

Output from the digital sigma-delta modulator may be coupled to a two-level digital-to-analog converter (two-level DAC) 220. In some embodiments, this DAC may comprise a two-level current source, as depicted in FIG. 2D, though other embodiments may be used. In some embodiments, the output 250 of the two-level DAC 220 may drive an amplifier (not shown) having a gain such that the average values of the resulting voltage signals for all word inputs to the test-signal generator span the full input voltage range of the ADC.

According to some embodiments, there is no analog reconstruction filter connected between the test-signal generator 105 and the ADC 110. The inventors have recognized and appreciated that some conventional ADC calibration techniques use an analog reconstruction filter before the ADC 110 to process a test signal and produce a clean (smooth and/or constant) analog signal at the input of the ADC. The inventors have also recognized that including an analog reconstruction filter would require an appreciable amount of substrate real estate if included on-chip. For example, an analog reconstruction filter may require more space on-chip than an ADC 110, and therefore may not be practical for some implementations. A test-signal generator 105 comprising a first-order, digital sigma-delta modulator would require less on-chip real estate.

Figure 3A:
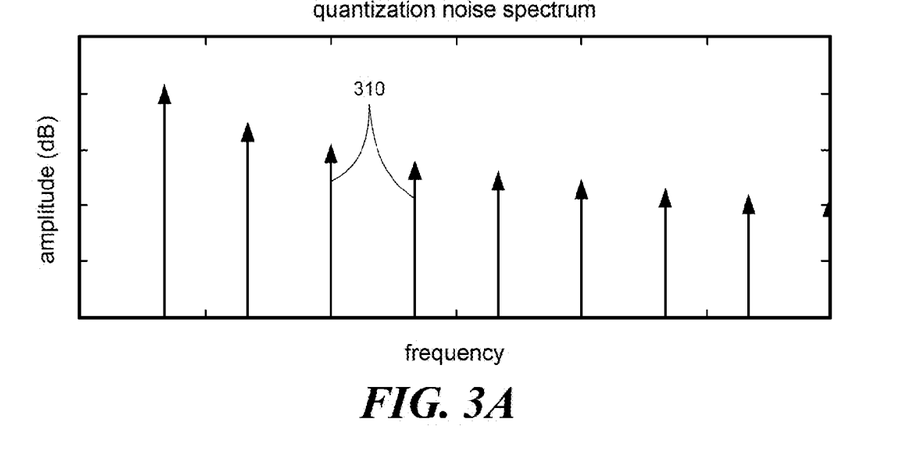
FIG. 3A illustrates noise tones in the frequency domain that may be introduced by a sigma-delta modulator of a test-signal generator, according to some embodiments.

The inventors have further recognized and appreciated that a first-order, digital sigma-delta modulator driven by a DC input signal produces a quantization noise spectrum consisting of discrete tones 310 in the frequency domain, as depicted in FIG. 3A. In further detail, a full-scale input range from a digital, first-order, sigma-delta modulator 210 may be denoted as [−1:1], and received digital words at the digital input 101 may be converted to a discrete set of pulse density waveforms that may be scaled by the two-level DAC 220 to yield average values that span the range from −1 to 1. For example, if the resolution of the ADC is N bits, then the digital words input to the sigma-delta modulator 210 for calibration purposes may be selected to span the ADC's range with a subset of evenly distributed calibration points. The number of calibration points may be any desired value and may be selected to be 2M+1, where M is an integer value. M may be a value less than, equal to, or greater than N, the bit resolution of the ADC. In this case, calibration points range from −1 to +1, in steps of 1/M.

The inventors have recognized and appreciated that the quantization noise spectrum from the sigma-delta modulator is related to the discrete calibration points as follows. The input to the sigma-delta modulator may be denoted as J/M, whereby J is an integer that varies between −M and M in integer steps. The quantization noise of a First-order sigma-delta modulator driven by a DC input signal typically consists of a series of discrete tones. When the DC input signal equals J/M, the quantization noise spectrum introduced the modulator output consists of discrete tones with frequencies given by:

$$f_{noise} = K \times \frac{f_{clk}}{2M} \quad (1)$$

where $f_{clk}$ is the clocking frequency for the sigma-delta modulator, and K is an integer that ranges from 1 to M. Even though J varies between −M and M, the noise tones 310 appear at the same frequency locations for each value of J. Accordingly, the same digital filter 130 can be used to suppress noise for all 2M+1 calibration measurements.

Figure 3B:
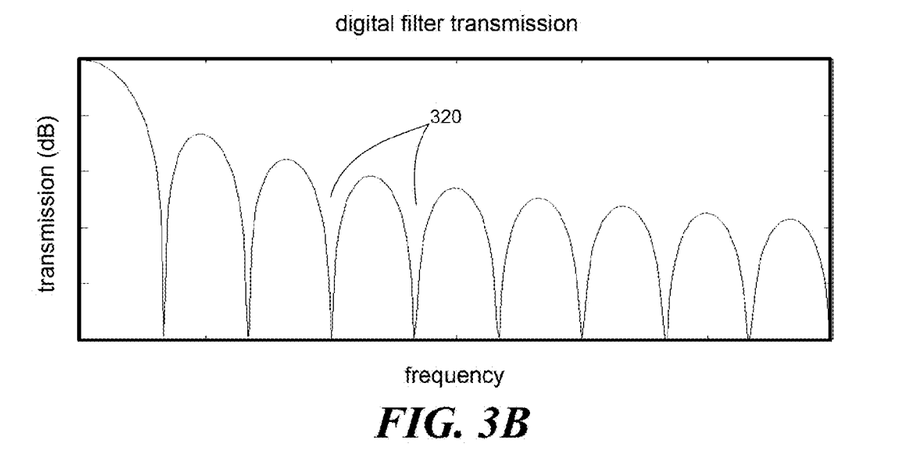
FIG. 3B illustrates a digital filter transmission in the frequency domain, according to some embodiments.

As depicted in FIG. 3A, applying digital words at the calibration input 101 to the sigma-delta modulator results in M equally-spaced discrete noise tones 310. The ADC output signal contains a wanted response at DC, but also contains perturbations due to the quantization noise tones. The inventors have recognized and appreciated that these perturbations can be selectively suppressed or substantially eliminated after analog-to-digital conversion with a digital filter 130. The resulting filtered digital signal is then suitable for determining distortion introduced by the ADC 110. According to some embodiments, the digital filter 130 comprises a notch filter having a filter characteristic depicted in FIG. 3B. For example, the filter transmission may comprise a plurality of notches 320 that are centered at, or centered approximately at, the frequencies of the quantization noise tones 310. When the filter notches occur at all quantization noise tone frequencies, then the quantization noise energy can be suppressed or substantially eliminated compared to the wanted signal at DC. For example, quantization noise energy may be suppressed between 20 dB and 50 dB compared to the DC signal, according to some embodiments.

Figure 3C:
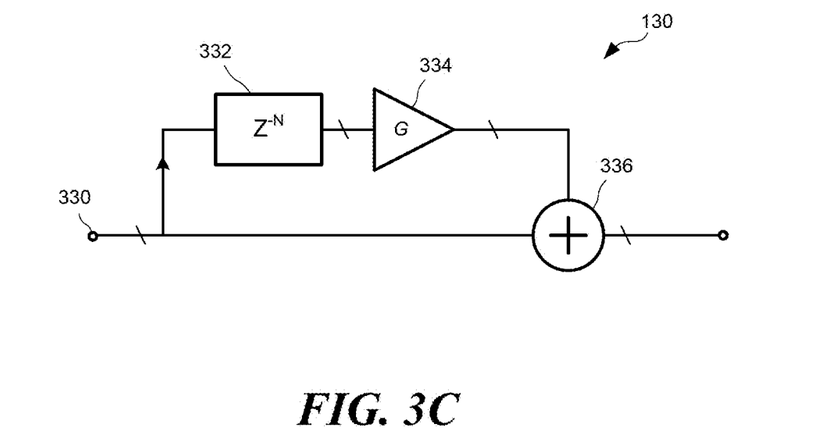
FIG. 3C depicts a circuit diagram for a digital comb filter, according to some embodiments.

In some embodiments, the digital filter 130 may be implemented as a digital comb filter. In some implementations, the digital filter 130 may be a moving-average filter, averaging the ADC output signal over a multiple of 2M clock cycles. An example of digital comb filter is depicted in the circuit diagram of FIG. 3C. A digital comb filter may comprise a digital delay 332 of P samples, digital gain 334, and a digital adder 336.

Figure 4:
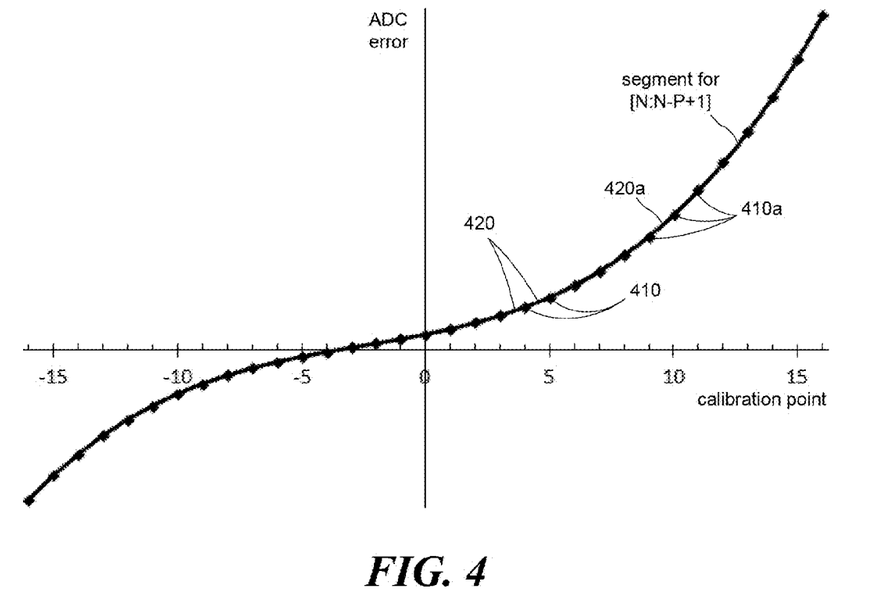
FIG. 4 illustrates measured ADC errors, according to some embodiments.

By filtering out the noise tones 310, the recovered digital signals at the calibration output terminal 150 may be compared against the digital word applied at the calibration input terminal 101 to determine ADC errors. An example of ADC conversion error values 410 for each of the 2M+1 calibration points (e.g., 33 points according to one embodiment) is depicted in FIG. 4 as the diamond-shaped dots. Each of the measured error values 410 represents the deviation or distortion of a converted analog signal from an expected or ideal conversion value at the calibration point. These conversion errors or their corresponding correction values (i.e., values that, when added a digital signal from the ADC 110, compensate for distortions introduced by the ADC) may be determined by a signal processing circuit 170, and fed to a distortion corrector 120, so that converted signals from the ADC 110 can be corrected to provide a more accurate output signal at the digital output terminal 140. In some embodiments, the measured errors or quantities derived from the measured errors may be stored in a look-up table and used later to correct converted signals output from the ADC. For example, the stored values may be added to or subtracted from ADC output values or used to calculate correction values that are added to or subtracted from ADC output values.

As described above, the 2M+1 calibration points may be distributed over the range of the ADC and evenly spaced. In some implementations, the calibration points may not be distributed evenly over the ADC range. According to some embodiments, ADC error values along the segments 420 between the calibration points may be calculated by interpolation from adjacent measured error values 410 using a polynomial fit (e.g., a second-order polynomial or higher-order polynomial) to the adjacent error values. Other functional fits may be used in some embodiments. As an example, fitting parameters may be calculated for a segment 420a based on three or more adjacent measured error values 410a. When a second-order polynomial function is used, the fitting parameters may comprise the coefficients $c_0, c_1, c_2$ in the following expression where $V_n$ corresponds to a measured ADC digital output value.

$$ADC_{error} = c_0 + c_1 V_n + c_2 V_n^2 \quad (2)$$

Any suitable regression analysis may be used to determine the coefficients, e.g., ordinary least squares analysis, linear regression, etc. Once the fitting parameters have been calculated, interpolated $ADC_{error}$ values may be computed for other ADC values. Determination of the fitting parameters and the interpolation of ADC errors may be done by the distortion corrector 120, according to some embodiments, or may be done by a signal processing circuit 170. In some implementations, both the signal processing circuit 170 and distortion corrector may participate in determining the fitting parameters and interpolating values of ADC errors.

Although EQ. 2 uses a second-order polynomial to estimate interpolated ADC errors, higher-order polynomials may be used in some embodiments. According to some implementations, a third-order polynomial, or higher, may be used to estimate ADC errors. For higher-order polynomials, additional coefficient values $c_n$ may be determined.

According to some implementations, the fitting parameters for each segment 420 may be computed based on a received ADC value. When a digital value is received from the ADC 110, a segment 420 corresponding to the received ADC value may first be identified. According to some embodiments, an identifier for a segment 420 may comprise the P most significant bits (MSBs) of a converted signal from the ADC, where P corresponds to the number (2M+1) of measured ADC error values 410 that are used to calibrate the ADC 110 according to the following expression: $P = \log_2(2M)$. For the above example that uses 33 calibration points (M=16 and P=5), each of the 32 segments 420 between the measured ADC errors 410 may be identified from the 5 most significant bits (MSBs) of the converted ADC signal. The upper bits may be read from the received ADC digital signal, and used to identify a segment 420a. Once the segment is identified, measured error values 410a adjacent the segment may be retrieved from storage (e.g., from a look-up table (LUT)) that may be indexed with the segment identifier. As an example, the segment 420a depicted in FIG. 4 may represent the +9$^{th}$ segment, and may be identified by the 5 most significant bits [01001] in a digital output from the ADC 110. The distortion corrector may then retrieve error values 410a for this segment, and compute an ADC error and/or correction value for the output from the ADC 110.

Figure 5:
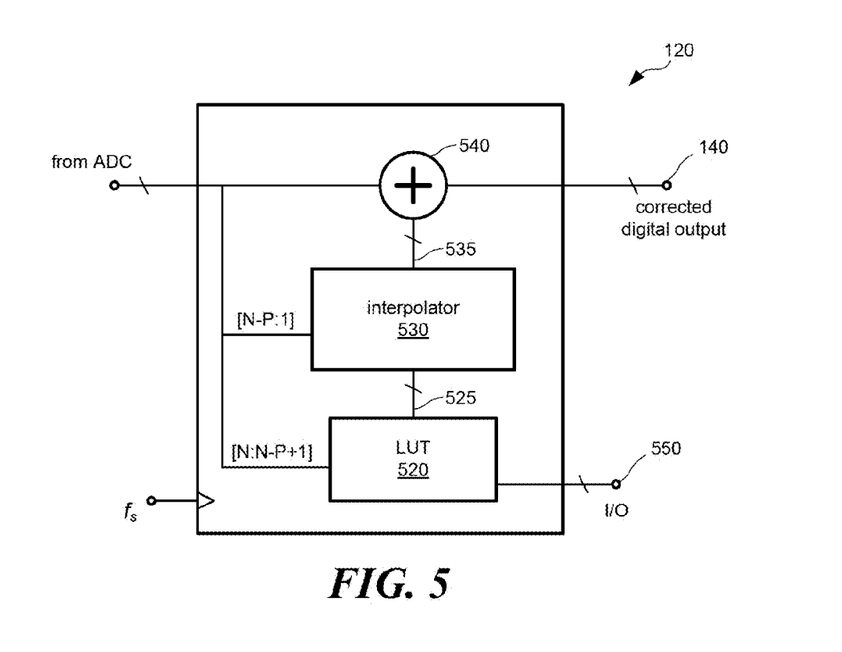
FIG. 5 depicts a distortion corrector, according to some embodiments.

FIG. 5 gives just one embodiment of a distortion corrector 120 that may be used in some implementations. In some embodiments, the distortion corrector may comprise memory and/or digital logic elements integrated on a chip with the ADC 110. In some cases, functionality of a distortion corrector may be programmed into signal processing circuit 170, and a separate distortion corrector 120 may not be used. A distortion corrector may comprise a look-up table (LUT) 520, an interpolator 530, and a digital adder 540. Digital values from the ADC 110 may be provided to a first summing input of the adder 540, and computed correction values from interpolator 530 may be provided to a second summing input of the adder 540. The correction values may be added to the digital values received from the ADC 110 and the resulting corrected digital values may be provided to an output terminal 140. The interpolator 120 may be clocked at a frequency $f_s$ that is the same as the sampling frequency of the ADC 110.

In some embodiments, a multiplier (not shown) may be used instead of an adder 540 in the circuit of FIG. 5. In such an embodiment, digital values received from the ADC 110 may be multiplied, at the multiplier, by correction factors provided from the interpolator 530. In some implementations, correction factors may be stored in and provided directly from the LUT 520, and an interpolator may not be used. The multiplication of a received digital value by a corresponding correction factor scales the digital value to a more accurate value.

The LUT 520 may comprise RAM memory elements, flipflops, or other memory elements, according to some embodiments, and data may be written to, and read from, the LUT 520 over an input-output data port 550. The LUT may store 2M+1 values (e.g., correction or error values determined using the test-signal generator 105 and digital filter 130 as described above). The value of M may range from 12 to 24 in some embodiments, though fewer or more values may be used in other cases. The entries of the LUT may be calculated correction values, or may be measured ADC errors from which correction values may be calculated.

The LUT 520 may receive all or a portion of each digital output value from the ADC 110. In some implementations, additional bit-sorting circuitry (not shown) may be included with the distortion corrector to provide the LUT with only the P most significant bits of each digital value received from the ADC 110. In some embodiments, the LUT may be configured to recognize the P most significant bits of each digital value received from the ADC 110. Regardless of how the P most significant bits are provided to or identified by the LUT 520, the LUT may be configured to provide three or more measured ADC error values, or their corresponding correction values, to interpolator 530 over a digital connection 525. The provided values may be identified by the P most significant bits.

Interpolator 530 may comprise data processing circuitry (e.g., computational logic circuitry, digital-signal processing circuitry, field-programmable gate arrays, or the like) that receives the three or more values from the LUT 520 and receives or identifies the remaining lower bits (e.g., [N-P:1]) of a received digital signal from the ADC 110. The interpolator 530 may compute an ADC error value and/or corresponding correction value based on the received values from the LUT and the lower bits of the received digital signal. For example, the interpolator may compute fitting parameters for a function that fits the values received from the LUT, and then compute a correction value based upon these fitting parameters and the lower bits of the received digital signal. For example, the fitting parameters may comprise polynomial coefficients that are used in EQ. 2 and the lower bits may be used for the value $V_n$. Once a correction value is computed, it may be added to the digital signal from the ADC by adder 540 to compensate for distortions introduced by the ADC 110.

Referring again to FIG. 1 and FIGS. 3A-3B, because a digital filter 130 after the ADC 110 suppresses the quantization noise tones introduced by a sigma-delta modulator 210, an analog reconstruction filter is not required at the input of the ADC for calibration measurements. Removal of the reconstruction filter simplifies the circuitry of the test-signal generator. As a result, quantization noise tones 310 originating from the first-order sigma-delta modulator can be applied substantially unfiltered, in some embodiments, to the input of the ADC 110.

However, the inventors have recognized and appreciated that the unfiltered noise tones 310 can introduce higher-order errors in the ADC 110. For example, an ADC typically exhibits nonlinearity in its conversion of analog signals, as depicted in FIG. 1A. Due to the nonlinear ADC characteristic, intermodulation and harmonic distortion products of these quantization noise tones 310 can be generated by the ADC 110. The intermodulation and harmonic distortion products typically have values that are small in magnitude compared to the noise tones 310. Since the quantization noise tones are all at equidistant frequencies according to EQ. 1, all signal energy of these intermodulation and harmonic distortion components will appear either at DC or at multiples of $f_{clk}/2M$. Therefore, except for the signal energy at DC, all other intermodulation and harmonic distortion components will fall on top of the quantization noise tones 310, and are also filtered by the notches 320 of the digital filter 130.

However, a digital filter 130 may not suppress the intermodulation and harmonic distortion products that appear at DC. For example, the digital filter transmission curve in FIG. 3B does not suppress signals appearing at DC. The DC component may then introduce a perturbation to the true ADC response. This can result in a measurement error during the calibration measurements that can limit the ultimate accuracy of the correction performed by distortion corrector 120.

The inventors have recognized and appreciated that distortion components at DC can be reduced by placing a small analog low-pass filter prior to the ADC input. For example, an analog low-pass filter 620 may be placed after the two-level DAC 220, as depicted in the calibration circuit 602 of FIG. 6A. The attenuation of the low-pass filter for the noise tones need not be significant, for example between approximately 2 dB and approximately 6 dB in some embodiments. Since the intermodulation and harmonic distortion products are proportional to the third or higher powers of the noise tones 310, a small amount of attenuation of the noise tones prior to the ADC 110 will appreciably attenuate intermodulation and harmonic products falling at DC. For example, when all the quantization noise tones at the input to the ADC 110 are attenuated by a factor of two by an analog filter 620, their third-order intermodulation products are attenuated by a factor of eight, their fifth-order intermodulation products are attenuated by a factor 32, etc. Therefore, even small filter attenuations will yield a considerable reduction in measurement error caused by components falling at DC. Accordingly, filtering requirements imposed on the analog lowpass filter 620 are relaxed compared with the requirements of a conventional analog reconstruction filter that is used to attenuate the quantization noise tones to a level below the required measurement accuracy level.

In some embodiments, the intermodulation products of quantization noise tones 310 are small compared to the quantization noise tones themselves. This is especially true when the ADC nonlinearity is a mild nonlinearity. Voltage-controlled oscillator (VCO) based ADCs typically exhibit mild conversion nonlinearity. Therefore, the embodiments are well suited for use with VCO-based ADCs.

Figure 6A:
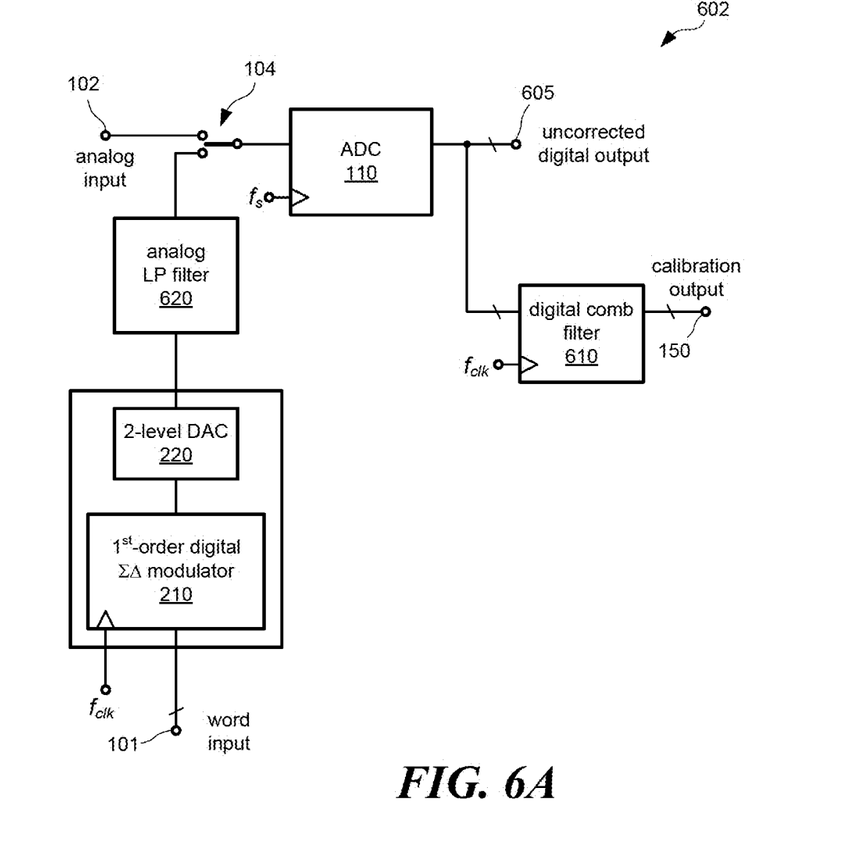
FIG. 6A depicts circuitry that may be used for calibrating an ADC, according to some embodiments.

Another noise consideration relates to the two-level DAC. Because there is no analog reconstruction filter, thermal noise at the output of the two level DAC 220 can appear unfiltered at the input of the ADC 110. Some of this noise may not be filtered by the low-pass filter 620. Together with the white noise of the ADC, the combined noise can create thermal and white noise-related errors during calibration measurements. However, measurement errors due to white noise can be reduced by averaging the white noise over a longer measurement time. For example, doubling the calibration measurement time yields a reduction of this measurement error by 3 dB.

Another source of noise is flicker noise introduced by the two-level DAC 220. The flicker noise may also appear unfiltered to the input of the ADC. Together with the flicker noise of the ADC itself, the combined flicker noise can create flicker noise-related measurement errors during calibration measurements. Since flicker noise is typically concentrated at low frequencies, increasing the measurement time during calibration has a small effect on reducing error caused by the flicker noise.

The inventors have recognized and appreciated that the effect of flicker noise can be reduced by changing an order in which calibration measurements are made. One method for making calibration measurements is to sweep the input signal to the ADC 110 monotonically from a lowest value to a highest value over the range of the ADC or vice versa. For example, a calibration process may consist of 2M+1 calibration measurements with DC input signals given by J/M, where J ranges from −M to +M in unit steps. The resulting measurements would be:
1) Measurement with J=−M.
2) Measurement with J=−M+1.
3) Measurement with J=−M+2.
. . .
2M+1) Measurement with J=+M.

Instead of making the calibration measurements according to the above sequence, the influence of flicker noise can be attenuated by the following measurement algorithm:
1) Measurement with J=−M minus measurement with J=0.
2) measurement with J=−M+1 minus a new measurement with J=0.
3) measurement with J=−M+2 minus a new measurement with J=0.
. . .
2N+1) measurement with J=+M minus a new measurement with J=0.

The above calibration measurement sequence that subtracts a reference measurement at a fixed value can attenuate flicker noise according to a technique known as "correlated double sampling". The flicker noise is filtered with a filter characteristic given by:

$$|H(f)|=|2 \sin \pi f T_m| \quad (3)$$

where $T_m$ is the duration of one calibration measurement. Since flicker noise is dominant at low frequencies where $|H(f)|$ is smaller than one, the effect of flicker noise can be reduced using the correlated double sampling technique.

Figure 6B:
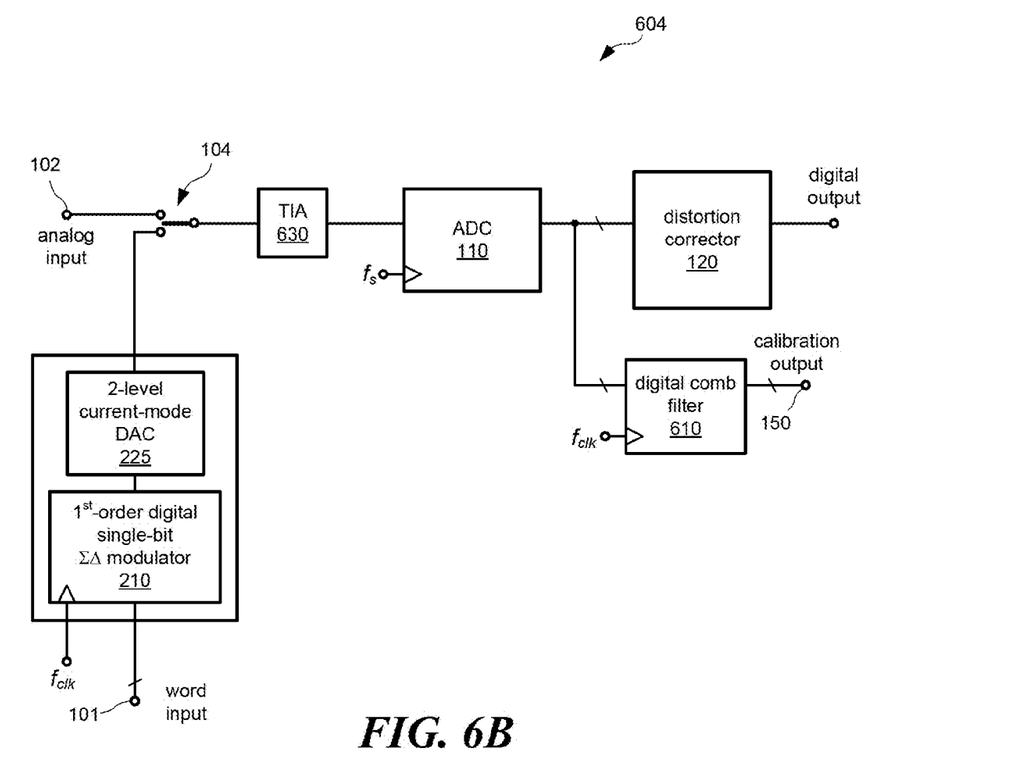
FIG. 6B depicts circuitry that may be used for calibrating an ADC, according to some embodiments.

FIG. 6B depicts another embodiment of a calibration and ADC circuit 604 for measuring the DC-transfer characteristic of an ADC 110. This circuit, like the circuit shown in FIG. 6A, may be part of a radio-frequency receiver front end. Components of these circuits have been described above, and will not be repeated. The calibration circuits 602, 604 may contain an ADC 110 with an LUT-based post-distortion corrector 120 (e.g., a corrector as depicted in FIG. 5).

For the circuit of FIG. 6B, during normal operation an input terminal 102 may be connected by switch 104 to a transimpedance amplifier (TIA) 630, which is configured to convert a current-mode input signal to voltage mode. According to some embodiments, the TIA incorporates a low-pass filter. The filtering by the TIA 630 may eliminate the need for a separate analog low-pass filter 620 depicted in FIG. 6A, according to some embodiments, and may be sufficient to suppress intermodulation and harmonic distortions below a level that permits a desired measurement accuracy of ADC errors during calibration measurements. In some embodiments, a filtering characteristic of a TIA 630 may be set during calibration measurements to attenuate signals for frequencies up to about $f_{clk}/2$ between approximately 2 dB and approximately 6 dB to suppress intermodulation and harmonic distortions.

During a calibration procedure, a switch 104 preceding the TIA may force the input signal from input terminal 102 to be equal to zero (e.g., ground the input), while connecting an output from a two-level current-mode DAC 225 to the TIA input. The two-level DAC 225 may be driven by a signal obtained from a single-bit, first-order, digital sigma-delta modulator 210. The sigma-delta modulator may be driven by a clock signal at a frequency $f_{clk}$, and a constant digital multi-bit calibration signal may be applied to the calibration input terminal 101 of the sigma-delta modulator for each calibration measurement. This calibration input signal can span 2M+1 discrete values (e.g., −M/M, (−M+1)/M, (−M+2)/M, . . . (M−1)/M, M/M) at the output of the two-level DAC 220, according to some embodiments.

During calibration, the TIA 630 may provide low-pass filtering, and attenuate the discrete quantization noise tones 310 appearing at multiples of $f_{clk}/2M$ that are generated by the single-bit, first-order, digital sigma-delta modulator 210. In this way, measurement errors due to intermodulations of quantization noise tones, generated by the nonlinear ADC characteristic, can be largely prevented.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A calibration circuit for an analog-to-digital (ADC) converter, the calibration circuit comprising:
a test-signal generator comprising a first-order, digital, sigma-delta modulator that is configured to be connected to an analog input of the ADC;
a digital-to-analog converter (DAC) arranged to be coupled between an output of the test-signal generator and the analog input of the ADC; and
a digital filter connected to an output of the ADC, wherein the digital filter has attenuating notches at a plurality of frequencies that correspond to frequencies at which quantization noise tones are generated by the test-signal generator.

2. The calibration circuit of claim 1, wherein the sigma-delta modulator is configured to produce an output signal that varies between only two signal levels and the DAC is configured to convert an input signal having only two signal levels.

3. The calibration circuit of claim 1, wherein the ADC comprises a voltage-controlled-oscillator-based ADC.

4. The calibration circuit of claim 1, wherein the ADC comprises a multi-bit sigma-delta modulator.

5. The calibration circuit of claim 1, wherein a bit resolution of the ADC is any integer value from N=12 to N=24.

6. The calibration circuit of claim 1, wherein the digital filter is a digital comb filter.

7. The calibration circuit of claim 1, wherein the test-signal generator is configured to output a pulse-density modulated signal.

8. A calibration circuit for an analog-to-digital (ADC) converter, the calibration circuit comprising:
a test-signal generator configured to be connected to an analog input of the ADC;
a digital filter connected to an output of the ADC, wherein the digital filter has attenuating notches at a plurality of frequencies that correspond to frequencies at which quantization noise tones are generated by the test-signal generator; and
a low-pass filter arranged to be coupled between the output of the test-signal generator and the analog input to the ADC.

9. The calibration circuit of claim 6, wherein the low-pass filter is an analog low-pass filter and has a cut-off frequency at a value approximately equal to or smaller than $f_{clk}/2M$, where $f_{clk}$ is a clock frequency at which the test-signal generator is configured to operate and 2M+1 corresponds to a number of calibration measurements for the ADC.

10. The calibration circuit of claim 6, wherein the low-pass filter is included in a transimpedance amplifier that is coupled to an input of the ADC, and the low-pass filter has a cut-off frequency at a value approximately equal to or greater than fclk/2M, where fclk is a clock frequency at which the test-signal generator is configured to operate and 2M+1 corresponds to a number of calibration measurements for the ADC.

11. The calibration circuit of claim 6, wherein the low-pass filter attenuates at least some of the quantization noise tones by at least 2 dB.

12. A calibration circuit for an analog-to-digital (ADC) converter, the calibration circuit comprising:
a test-signal generator configured to be connected to an analog input of the ADC; and
a digital filter connected to an output of the ADC, wherein the digital filter has attenuating notches at a plurality of frequencies that correspond to frequencies at which quantization noise tones are generated by the test-signal generator, wherein the test-signal generator is configured to operate at a clock frequency $f_{clk}$ and the attenuating notches of the digital filter are located at integer multiples of $f_{clk}/2M$ where 2M+1 corresponds to a number of calibration measurements for the ADC.

13. A calibration circuit for an analog-to-digital (ADC) converter, the calibration circuit comprising:
a test-signal generator configured to be connected to an analog input of the ADC;
a digital filter connected to an output of the ADC, wherein the digital filter has attenuating notches at a plurality of frequencies that correspond to frequencies at which quantization noise tones are generated by the test-signal generator; and
a distortion corrector coupled to an output of the ADC, wherein the distortion corrector is configured to compensate for distortion introduced by the ADC,
wherein the distortion corrector comprises a look-up table and an interpolator.

14. The calibration circuit of claim 13, wherein the interpolator is configured to receive values from the look-up table and compute an interpolated correction value that is used to correct a digital signal from the ADC, and wherein the computed interpolated correction value is based upon the received values from the look-up table.

15. The calibration circuit of claim 14, wherein the distortion corrector is configured to select the received values from the look-up table based upon a portion of the digital signal received from the ADC to which the computed interpolated correction value is applied.

16. A method for calibrating an analog-to-digital converter (ADC), the method comprising:
applying a calibration signal from a test-signal generator to an analog input of the ADC; and
filtering an output digital signal from the ADC with a digital filter, wherein the digital filter has attenuating notches at a plurality of frequencies that correspond to frequencies at which quantization noise tones are generated by the test-signal generator.

17. The method of claim 16, wherein the test-signal generator comprises a first-order, digital, sigma-delta modulator that outputs a signal having only two signal levels, and the method further comprises:
converting an output from the sigma-delta modulator with a two-level digital-to-analog converter (DAC) configured to receive only two input signal levels; and
low-pass filtering an output from the two-level DAC.

18. The method of claim 16, further comprising:
applying a first calibration value to the input of the test-signal generator;
receiving a first output value from the ADC;

applying a reference value to the input of the test-signal generator;

receiving a reference output value from the ADC;

calculating a first difference value by taking a difference between the first output value and the reference output value; and calibrating the ADC for the first calibration value based upon the first difference value.

19. The method of claim 18, wherein the reference value corresponds to a value that is approximately at a middle of an input range for the ADC.

* * * * *